(12) United States Patent
Seger

(10) Patent No.: US 7,552,376 B2
(45) Date of Patent: Jun. 23, 2009

(54) MODELING ERROR CORRECTION CAPABILITY WITH ESTIMATION OF DEFECT PARAMETERS

(75) Inventor: Paul J Seger, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 792 days.

(21) Appl. No.: 11/261,037

(22) Filed: Oct. 28, 2005

(65) Prior Publication Data

US 2007/0101213 A1    May 3, 2007

(51) Int. Cl.
*H03M 13/00* (2006.01)

(52) U.S. Cl. .................... 714/755; 714/762; 714/786; 714/788; 703/13

(58) Field of Classification Search .............. 714/755, 714/762, 786, 788; 703/13
See application file for complete search history.

(56) References Cited

U.S. PATENT DOCUMENTS

| | | | |
|---|---|---|---|
| 5,131,038 A | 7/1992 | Puhl et al. |
| 5,233,628 A | 8/1993 | Rappaport et al. |
| 5,377,264 A | 12/1994 | Lee et al. |
| 5,794,128 A | 8/1998 | Brockel et al. |
| 5,862,177 A | 1/1999 | Cummings et al. |
| 5,883,958 A | 3/1999 | Ishiguro et al. |
| 6,111,953 A | 8/2000 | Walker et al. |
| 6,219,791 B1 | 4/2001 | Blanchard et al. |
| 6,230,267 B1 | 5/2001 | Richards et al. |
| 6,430,615 B1 | 8/2002 | Hellerstein et al. |
| 6,678,730 B2 | 1/2004 | Hellerstein et al. |
| 6,748,280 B1 | 6/2004 | Zou et al. |
| 6,826,521 B1 | 11/2004 | Hess et al. |

OTHER PUBLICATIONS

T. Berman, et al: "Non-interleaved Reed-Solomon coding over a bursty channel"; Military Communications Conference, 1992; Milcom '92, Conference Record; Communications—Fusing Command, Control and Intelligence., IEEE San Diego, CA, USA; Oct. 11-14, 1992, New York, NY, USA, IEEE, US, Oct. 11, 1992; pp. 580-583.

(Continued)

*Primary Examiner*—Guy J Lamarre
*Assistant Examiner*—Sam Rizk
(74) *Attorney, Agent, or Firm*—Dan Shifrin

(57) ABSTRACT

A method, system and program product accurately model the error characteristics of a communications system, such as a tape storage system. Input parameters are entered which describe defect rates and sizes, Codeword Data Structure bytes, and any interleaving factor. Bit defects from simulated defect sources are generated, defined by the starting and ending bits of each defect within a codeword. Any codewords which are defect-free are filtered out and not processed further, thereby increasing the processing speed of the model. Within the defect streams, overlapping defects are merged, redefining defect regions by starting and ending bits. Because only the definitions are processed, not the entire length of the codewords or defects, processing efficiency is further enhanced. The number of defects that occur in each codeword is determined and the probability of the occurrence of N bytes in error per processed codeword may be computed. If desired, a histogram may be generated which includes the rate at which errors occurred and subsequently used to estimate the probability of an error event. Such information may then be incorporated into the design of an error correction code for the modeled system.

31 Claims, 4 Drawing Sheets

OTHER PUBLICATIONS

Peter J. Smith, et al: "The Impact of G.826 on the Performance of Transport Systems," IEEE/ACM Transactions on Networking; IEEE/ACM, New York, NY, US; vol. 4, No. 4, Aug. 1996.

Cheng-Xiang Wang, et al: "A new deterministic process based generative model for characterizing bursty error sequences", PIMRC 2004. 15TH IEEE International Symposium on Personal, Indoor and Mobile Radio Communications; Barcelona, Spain; Sep. 5-8, 2004; Piscataway, NJ, USA; IEEE, vol. 3, Sep. 5, 2004; pp. 2134-2139.

Lampe et al. (2000) Proceedings of the IEEE Global Telecommunications Conference, pp. 965-970.

MODELING ERROR CORRECTION CAPABILITY WITH ESTIMATION OF DEFECT PARAMETERS

TECHNICAL FIELD

The present invention relates generally to data systems and, in particular, to modeling the error correction capability of a data system, such as a data storage system.

BACKGROUND ART

Estimating the error characteristics of communications systems, such as magnetic recording systems, is essential to designing error correction codes (ECC) to allow such systems to operate with vanishingly small probabilities of error. The term "communications" is used herein in its broad meaning to refer to any system in which information-bearing signals are transferred or transmitted from a source to a target. As is known, ECC is used to identify and correct errors during a transmission. Codes are specifically designed for different systems to correct up to a fixed number of bytes in error within a codeword. In order to design a sufficiently robust code and avoid loss of data from an unacceptably high rate of uncorrectable errors, it is therefore important to accurately analyze and estimate the distribution of errors (that is, the number of codewords in a data stream having one byte in error, the number of codewords having two bytes in error, etc.).

Modern systems employ complex data structures of interleaved ECC codewords. Interleaving alternates bytes from several codewords into a longer codeword structure spreads each codeword along a greater physical distance. However, because bytes of multiple codewords are now alternating, a single error event may influence multiple codewords. Consequently, error analysis is complicated by these new structures.

ECC models for magnetic hard disk drive (HDD) systems frequently assume that a bit or byte defect is an event which is independent and uncorrelated with any other event. Typically, errors in HDD systems are caused by white noise and are, in fact, random, independent events. Because hard disks are sealed, new defects generally do not occur after the drive is manufactured. Moreover, the same head assembly which is used to write data to the disk is used to later read the data from the disk. Consequently, tracking is generally consistent with few errors arising due to mistracking. Because the errors in an HDD system are independent, one can determine the probability of the occurrence of n errors by obtaining the probability of the occurrence of a single error event and raise it to the $n^{th}$ power.

As noted, the standard error model assumes that each error event is random and uncorrelated with every other error event. Such models begin with either a bit error rate or a byte error rate, then use the three equations below to predict probabilities of various error events.

$$P(n, k, p) = C(n, k) \cdot (1 - p)^{n-k} \cdot p^k \qquad \text{[Eq. 1]}$$

$$PG(n, k, p) = \sum_{j=k+1}^{n} P(n, j, p) \qquad \text{[Eq. 2]}$$

$$C(n, k) = \prod_{i=1}^{k} \frac{n+1-i}{i} \qquad \text{[Eq. 3]}$$

Eq. 1 predicts the probability of exactly k error events occurring in a sequence of n bits or bytes, given the probability p that any one bit or byte is in error. Eq. 2 predicts the probability that more than k error events occur in a sequence of n bits or bytes, given the probability p that any one bit or byte is in error. Both Eq. 1 and Eq. 2 use Eq. 3 which is one representation of the number of combinations of n things taken k at a time.

For example, assume that an ECC codeword with no interleaving contains n bytes and that the probability that any one byte is in error is p. Further assume that the ECC has the power to correct up to 5 bytes in error. A typical analysis computes the probability of codewords having 1, 2, 3, 4 and 5 bytes in error, which would be correctable error events for this system. In addition, the probability that more than 5 bytes are in error would give the probability that the ECC fails to correct the codeword. The probability that exactly k bytes are in error is P(n, k, p) (Eq. 1) and the probability that more than k bytes are in error is PG(n,k,p) (Eq. 2).

FIG. 1 shows the probability that the codeword has exactly n bytes in error based on the above equations, for n=1 to 5. Importantly, the plot illustrates that the calculated predicted results differ greatly from the measured performance of an actual interleaved system, thus demonstrating that the simple model is inadequate, particularly as the desired number of correctable bytes increases.

Variations on this model produce, for small values of p, the relation between the probability of 1 byte in error to the probability of other bytes in error:

$$P_1 = P(n, 1, p) \qquad \text{[Eq. 4]}$$

$$P_n = P_1^n \qquad \text{[Eq. 5]}$$

Unfortunately, such variations also poorly approximates a real world system. For example, a system with an interleave factor of two (a codeword pair structure whose bytes alternate between the bytes of two individual codewords) may show a probability of a one byte error that is predictable from the base probability of error. However, the probabilities for subsequent bytes in error follow a different slope determined by another probability $P_x$ which may be substantially larger than $P_1$.

$$P_1 = P(n, 1, p) \qquad \text{[Eq. 6]}$$

$$P_n = P_1 \cdot P_x^{n-1} \text{ for } 1 < n \qquad \text{[Eq. 7]}$$

It will be observed that regardless of the manipulation of the standard, random error rate model, the ratio of the probability of one byte in error to two bytes, two bytes to three, etc. must be the same. Observations of actual systems demonstrate that this is not the case and the standard model cannot be made to fit observations.

Thus, the standard model is too simple to model the real system. It uses a single variable to describe a defect: the rate at which defects occur. However, it is understood that defects have size and that not all defects are of the same size. Further, defects are not, in fact, independent events.

In the past, when ECC in a magnetic tape system was designed to identify and correct one or two bytes of a codeword in error, models based on HDD system assumptions may have been adequate. However, these assumptions make closed form analysis convenient, containable and relatively accurate for HDD systems, models based on such assumptions are overly simplistic for modern magnetic tape systems. Because tape media is not in a sealed environment as a hard disk is, defects may occur after manufacture and may, in fact grow over time. Moreover, tapes are frequently loaded into different tape drives whose tracking may differ slightly from one to another, thereby increasing the likelihood of errors.

With increased data densities, more complex interleaved codewords and the desire for more robust correction, the old models provide a poor fit to actual, real world systems and a need exists for more accurate modeling.

SUMMARY OF THE INVENTION

A method, system and program product are provided for accurately modeling the error characteristics of a communications system, such as a tape storage system. Input parameters are entered which describe defect rates and sizes, Codeword Data Structure bytes, and any interleaving factor. Bit defects from simulated defect sources are generated, defined by the starting and ending bits of each defect within a codeword. Any codewords which are defect-free are filtered out and not processed further, thereby increasing the processing speed of the model. Within the defect streams, overlapping defects are merged, redefining defect regions by starting and ending bits. Because only the definitions are processed, not the entire length of the codewords or defects, processing efficiency is further enhanced. The number of defects that occur in each codeword is determined and the probability of the occurrence of N bytes in error per processed codeword may be computed. If desired, a histogram may be generated which includes the rate at which errors occurred and subsequently used to estimate the probability of an error event. Such information may then be incorporated into the design of an error correction code for the modeled system.

DETAILED DESCRIPTION OF THE PREFERRED EMBODIMENT

Figure 1:
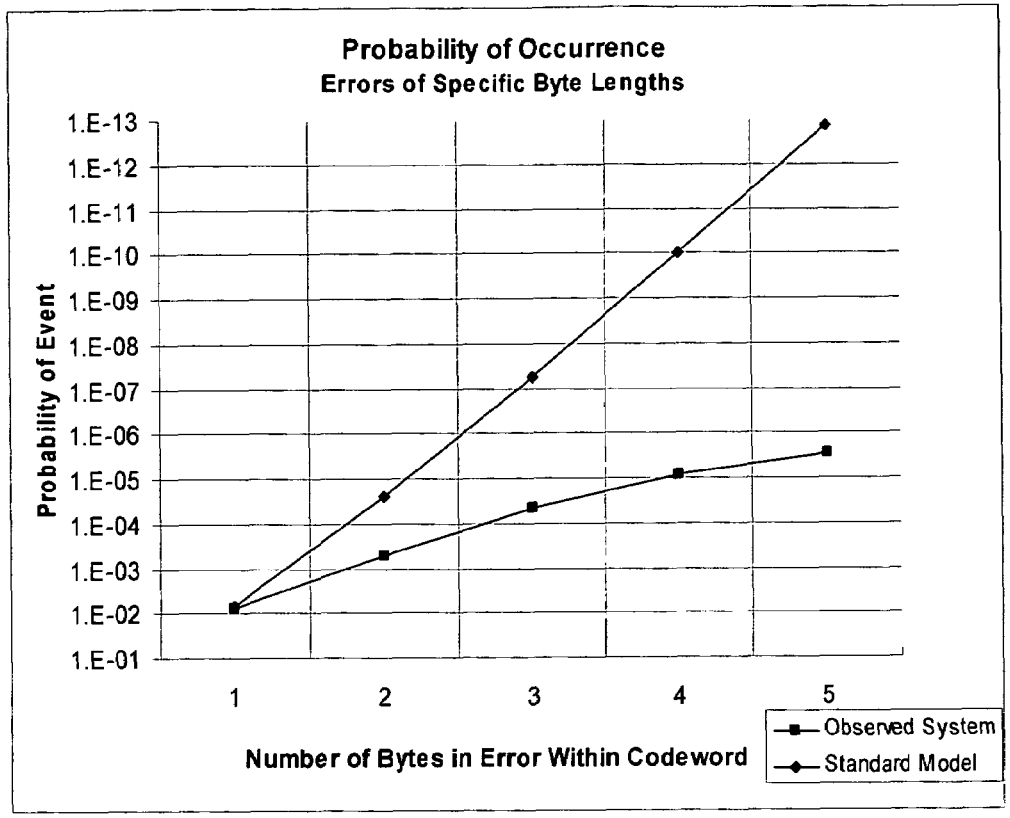
FIG. 1 is a plot of the probability of occurrence of errors of specific byte lengths for the standard model and for an observed system.

In order to develop a realistic model for the interleaved codeword, an analogy may be used to visualize the problem. The problem of predicting or simulating defects in an ECC codeword is analogous to tossing water balloons into a row of paint cans. Consider a row of paint cans without lids, starting close by and extending away. A water balloon is tossed at the row of paint cans. If the balloon lands beyond the row of cans, no can will contain water. If the balloon lands within the row of cans, one or more cans will get water in it, depending upon the size of the balloon and the alignment of the balloon with the cans' openings. A balloon smaller than one paint can diameter may put water into one or two cans, depending upon the alignment of the balloon and the can edges. A balloon larger than one can diameter will put water into at least two cans.

The paint can model can simulate ECC codewords and defects. The arrangement of paint cans represents a data structure with each can representing one byte in the data structure. Balloons represent defects. How often a balloon is tossed relates to the rate at which defects (balloons) are encountered. The size of the balloon, measured in eighths of a can diameter, is the defect size in bits.

Cans that contain water represents bytes that have suffered a defect. For ECC, it is unimportant whether the byte (can) had a little damage (water) or was obliterated—what is important is that the byte had a defect. If the toss is beyond the row of paint cans, then no defect occurred in the data structure. If the ECC can correct up to n bytes in error, and there are n or fewer paint cans containing water, then the codeword structure has no defects or is correctable.

The paint can model may be extended to simulate interleaved ECC codewords. For example, to simulate an interleave factor of two, the paint cans are colored in one of two alternating colors, white-yellow-white-yellow, for example. The number of white cans equals the number of yellow cans and the total number of cans is twice the number of cans in the non-interleaved model. There are now two codewords, each with the same number of bytes as before, and thus the ECC correction power remains the same.

Tossing water balloons at the row of paint cans has a similar interpretation for the interleaved model as for the non-interleaved. If the balloon lands beyond the row of cans, no can receives water. If the toss lands within the row of cans, one or more cans will get water depending upon the size of the balloon and the alignment of the balloon with the cans' openings. Interleaving affects the interpretation of damage. A balloon smaller than one can diameter may put water into one or two cans, depending upon the alignment of the balloon and the can edges, but water will be in at most one white and one yellow can. There will not be two cans of the same color with water in it. Therefore, in the analogy at most only one byte of each interleave will be damaged for a defect as large as 9 bits.

TABLE I shows the greatest number of bytes that can be affected for a non-interleaved and for a two-way interleaved codeword structure for defects of differing bit sizes.

TABLE I

| Defect Size (bits) | No Interleave | 2-Way Interleave |
| --- | --- | --- |
| 0 | 0 | 0 |
| 1 | 1 | 1 |
| 2-9 | 2 | 1 |
| 10-17 | 3 | 2 |
| 18-25 | 4 | 2 |
| 26-33 | 5 | 3 |

The paint can analogy thus may be used to illustrate requirements for a new model with some interpretation for the physical system being modeled, in this case, a magnetic tape storage system. Defects are produced—balloons tossed—at the tape as it goes by. Hence each new toss begins at the point on tape at which the previous defect event occurred. The result is that the start of defect locations is monotonically increasing relative to the tape length. Defects may overlap if the new defect begins before the previous defect disappears; that is, if the previous defect was longer in duration (larger) than the inter-arrival time of the next defect. Defects may be wholly contained within another defect if the new defect begins before the previous defect disappears and if the previous defect was longer in duration (larger) than the inter-arrival time of the next defect and its defect length. Defects may be independent if multiple defects occur within the structure but their inter-arrival times and defect lengths produce no interaction (overlap).

If there are multiple defect sources, which is typical, then each defect stream may be independent. Each new toss begins at the point on tape at which the previous defect event occurred for that defect source. To achieve high accuracy, a model should maintain defect sources as distinct entities, and then combine their results in some manner.

After defects are created from one or more defect streams, the defects should be aggregated to create the final data structure state that accounts for overlapping events, spillage across bit, byte, codeword, and codeword structure boundaries. The aggregated codeword structure is then analyzed to determine which bytes and in which interleaved codeword defects occur.

Requirements for a new model in accordance with the present invention include:
1) A data structure that represents the codeword structure with:
   Representation of bits within bytes;
   Representation of bytes within the larger structure; and
   Byte interpretation as non interleaved or interleaved as desired.
2) One or more defect sources each described by:
   A rate of arrival distribution; and
   A defect size distribution.
3) Accommodation of multiple and overlapping defects within the same codeword structure
   Errors may begin and end without overlapping other errors (independent);
   Errors may begin within an existing error but extend beyond that error's end (spanning); and
   Errors may begin within an existing error and end within that same error (contained)
4) Accounting for defect alignment:
   Bit errors that overlap byte boundaries;
   Byte errors that overlap codeword interleaving boundaries; and
   Errors that span into or out of codeword structures.

OVERVIEW OF THE MODEL OF THE PRESENT INVENTION

The model according to the present invention is a simulation that comprises a bit structure representing an interleaved codeword pair (although the model may be extended to no interleaving or to any number of interleaved codewords), one or more defect rate generators, one or more defect length generators and a means for assembling the defect state of resulting bits, bytes and codewords into data structures that are meaningful to the ECC evaluation.

The basis of the model is a Codeword Data Structure comprised of bits which represents the individual or interleaved codewords having a physical length along a tape medium.

Figure 2:
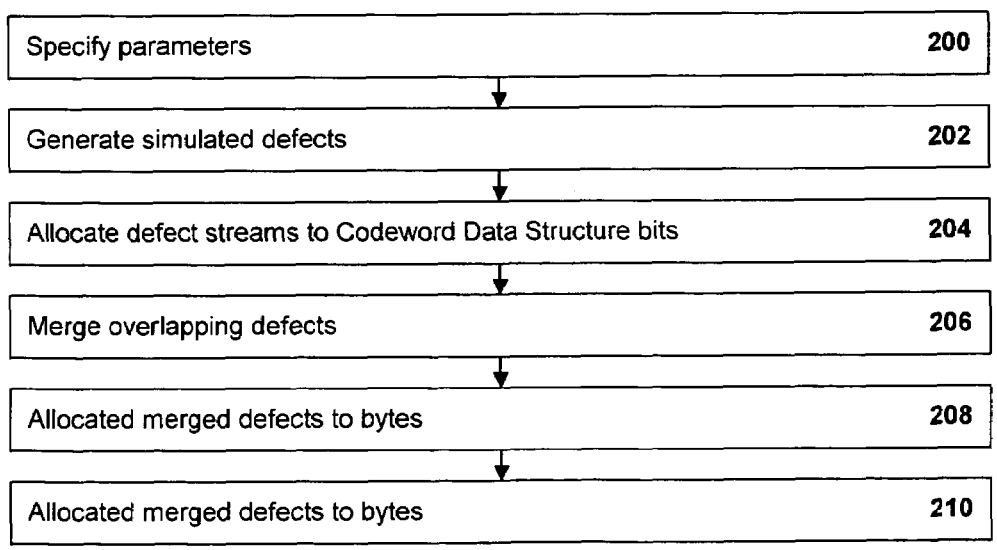
FIG. 2 is a flow chart of a process of the present invention.

Referring now to the flow chart of FIG. 2, the model simulates defects and evaluates their effects as follows:

(1) The parameters of the model are specified (step 200). This includes descriptions of the defects rates and sizes in terms of bits, the description of the Codeword Data Structure bytes and interleaving, and the number of Codeword Data Structures to process for each probability estimate.

(2) Bit defects from the defect sources are generated in the simulated tape space (step 202). Real-world defect sources include random defects and media defects, such as noise, media particles, coating defects, media creases, tape damage and head-to-tape tracking errors. Each defect source produces a stream of defects. Each defect has a starting bit and stopping bit location within the Codeword Data Structure. The number of defects in each defect stream, the locations and sizes are drawn from probability distributions. The number of defects due to a defect source may be zero in the current Codeword Data Structure. In the present invention, Codeword Data Structures which contain no defects need not be processed beyond this step (2), thereby permitting a great number of Codeword Data Structures to be processed.

(3) The defect streams are allocated to bits within the Codeword Data Structure (step 204). Overlapping bit defects are merged into unique defect regions having both location and size (step 206). Each Codeword Data Structure may have an indefinite number of unique defect regions which are the result of the multiple defect sources. That is, because both the starting location and the size of each defect are drawn from probability distributions, the total number of defects within a codeword structure due to a defect source is itself a random variable.

(4) The unique, merged defect bit regions are allocated to bytes, thereby producing defect bytes (step 208). Depending upon the interleaving factor, defect bytes are counted to produce the number of bytes with defects in the codewords. In the present invention, the actual bits and bytes of the Codeword Data Structure do not require processing. Rather, the defects are described by their start and stop bit locations. Only these descriptions are processed, thereby greatly increasing the efficiency of the present invention.

(5) The result is an array comprising a histogram of the number of codewords processed and the number of codewords having exactly k bytes in error, where k=[0 . . . m] (step 210). If interleaving is used, then values are available for each of the codewords within the codeword pair.

MODEL DETAILS

Model Inputs

Figure 3A:
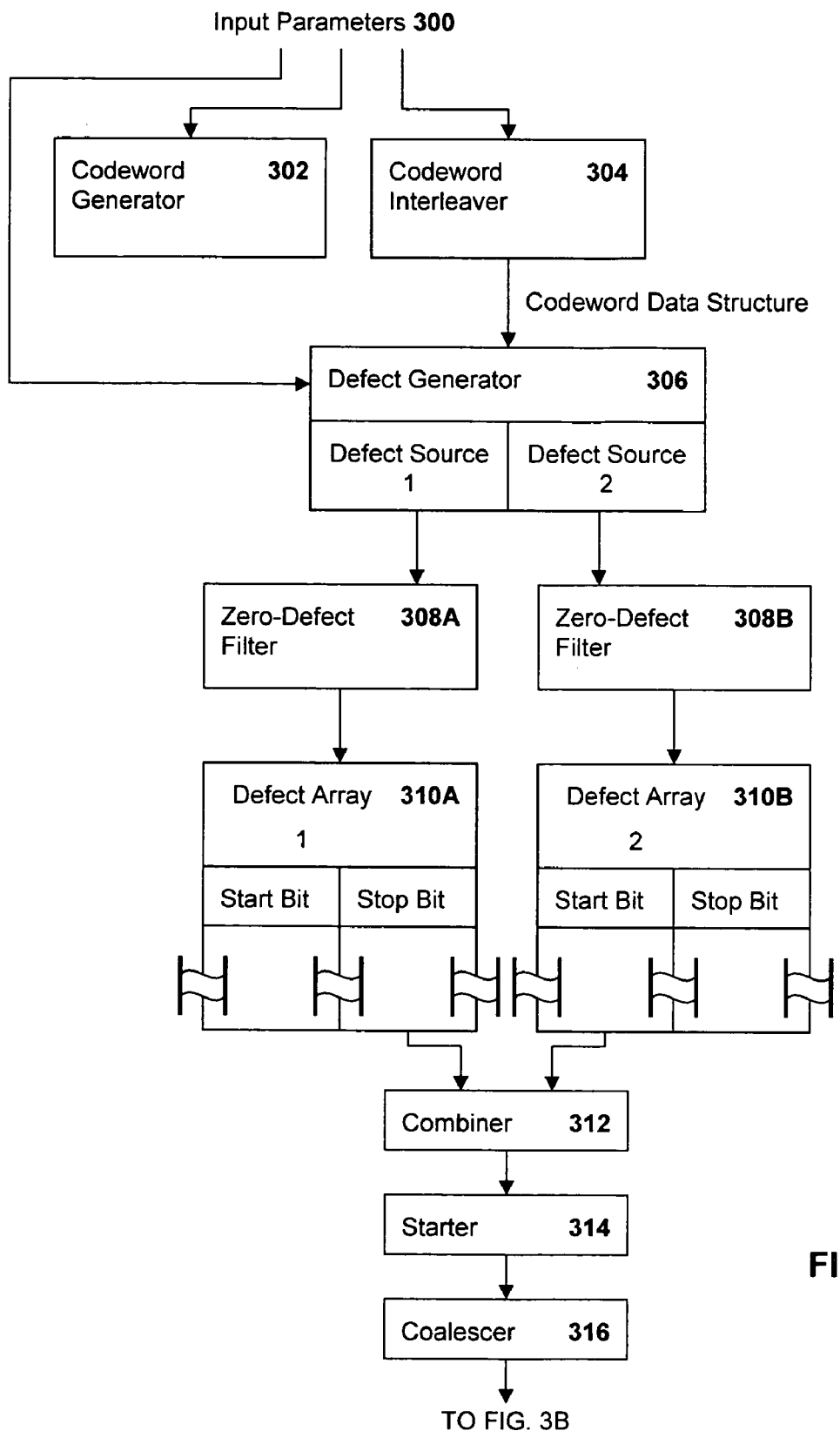
FIGS. 3A and 3B are a block diagram of a system in which the present invention may be implemented.
Figure 3B:
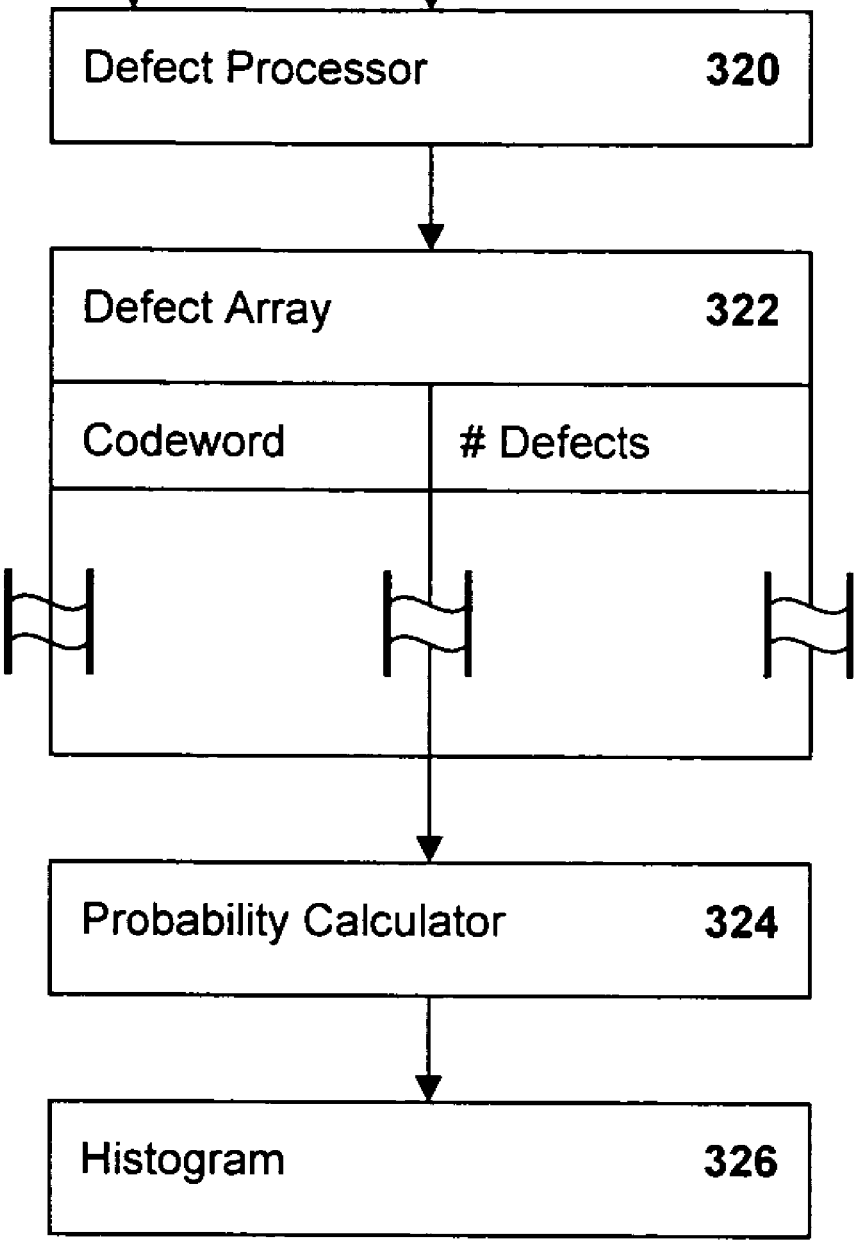

The present invention will now be described in more detail with reference to the block diagram of FIGS. 3A and 3B. The sample parameters 300 below describe one run of the model. For clarity, the parameters are shown as a 'pseudo structure' in the C programming language. Two defect sources are included, bit defects and media defects. In practice, any number of defect sources may be introduced.

```
typedef struct {
    bDR;         // bit defect rate in defects per meter
    bDS;         // bit defect size in mean bits per bit defect
    mDR;         // media defect rate in defects per meter
    mDS;         // media defect size in mean bits per media defect
    Interleave;  // number of interleaved codewords per codeword
                 //   structure
    CWbytes      // number of bytes per codeword
    bpmm;        // physical bit size given as bits per millimeter
    CWS;         // number of codeword structures processed for one
                 //   estimate
} MODEL_PARAMS;
```

The Codeword Data Structure

The Codeword Data Structure is an array that represents the total number of bits in the interleaved codeword structure. For purposes of this description, the structure consists of two interleaved byte streams called a codeword pair. The process is similar for no interleaving or for interleaving with a factor greater than two.

To increase processing speed, the Codeword Data Structure is not implemented as an array containing the number of bits or bytes. Such an implementation would be highly inefficient because the vast majority of Codeword Data Structures will contain no defects at all. Rather, the structure is implemented with an N×2 array, where N is the number of unique defect regions in the Codeword Data Structure. N will be zero for Codeword Data Structures in which no defects occurs. Each defect region is then described by two values: the bit number in the Codeword Data Structure at which the defect region begins and the bit number at which the region ends. The array is built dynamically in a codeword generator 302 and an interleaver 304 because the number of unique defect regions is not known a priori.

```
typedef struct {
    start;      // bit number at which the defect begins
    stop;       // bit number at which the defect end
} DEFECT;
DEFECT      DefectArray[n];    // array of defects. n = unique defects
```

Creating Codeword Defects

A defect generator 306 uses a CreateDefect algorithm to produce defects for each defect source using the defect rate, defect size and total number of bits (cells) into which defect may occur.

[location, length, num_defects]=CreateDefect
(defect _rate, defect_size, num_bits)

This module creates zero to many defects within the Codeword Data Structure having num_bits. Defects are created using an exponential distribution of defect_rate mean value. The size, in bits, of each created defect is drawn from an exponential distribution of defect_size mean value. Defects are created until the next defect starts beyond the end of the codeword structure. No defect occurs in the codeword structure if the first defect occurs beyond the end of the codeword structure. The function returns a matrix of defect locations and lengths in bits for each defect, and the number of defects that occurred. If no defect occurs in the codeword structure, the length of the array is zero.

CreateDefects is run for as many types of defects sources as are to be modeled. For example, random errors may be created using a defect rate and defect size corresponding to the random errors while media errors may be created using a defect rate and defect size corresponding to the media defect errors. Each instance of CreateDefects produces its own array of defect locations and lengths for the Codeword Data Structure being evaluated. A single model run may process a great many Codeword Data Structures.

Coalescing Defects

Filters 308A and 308B determine whether a Codeword Data Structure in either of the defect streams contains a defect. If the Codeword Data Structure contains no defects, no further processing is required for this structure. Codeword Data Structures in either stream that do contain one or more defects are left in arrays 310A and 310B, respectively, to be coalesced into the shortest remaining defects. Defects may require coalescing for two reasons. First, a defect stream may produce defects that overlap with other of its own defects. This occurs when the inter-arrival time of the next defect is shorter than the length of the current defect. Second, the defects of multiple defect streams may overlap.

There are four types of defects events. Independent defects, those which do not overlap, do not coalesce and therefore are not altered. Spanning defects, those which overlap, are aggregated into larger defects. Contained defects, those which are wholly contained within other defects, are subsumed. Defects which span into or out of the Codeword Data Structure are truncated at the codeword limits.

Figure 4:
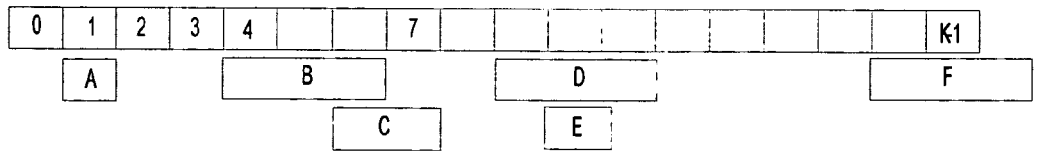
FIG. 4 illustrates codeword data structures prior to coalescing.

FIG. 4, represents a Codeword Data Structure containing the different types of defects. Defect A does not overlap any other defect and is therefore an independent defect. Defects B and C are spanning defects that overlap one another and will be coalesced into an extended defect length from bits 4 through 7. Defect E is wholly contained with defect D and will be subsumed, contributing no new effect. Defect F spans out of the Codeword Data Structure and therefore will be truncated at the end of bit K−1.

The nature of the model of the present invention allows efficient coalescing of all defect sources in one operation. This simplification results from noting that the sequence of coalescing steps may be changed to increase efficiency. If the defect streams are treated independently, the coalescing process is: coalesce defects for each defect stream, combine the coalesced defect streams, then coalesce the resulting combined stream. However, the same result may be obtained, with increased efficiency, if the steps instead are: combine the defect streams and then coalesce the combined defect stream. Coalescing is efficiently performed by this model because defects for each defect source are described only by their starting bit number and length in bits. (It will be appreciated that defect descriptions using starting bit number and length in bits is interchangeable with descriptions using starting and stopping bit numbers.) Furthermore, the starting defect location is known to be monotonically increasing for each defect source.

The multiple defect streams are combined in a combiner 312 and processed into a final Codeword Data Structure with all defects merged. The individual defect streams from all sources are first concatenated into one array. The array is then sorted in a sorter 314 in ascending order by starting location. The sorted array is processed in a coalescer 316 by a coalescing algorithm to produce the final Codeword Data Structure 318.

Coalescing Algorithm

The coalescing algorithm of the present invention processes the defect arrays as follows, again presented as a 'pseudo structure' in the C programming language:

```
Current_Start = Get_Start_of_Current_Defect( );
Current_Stop = Get_Stop_of_Current_Defect( );
while(defects_remain_to_be_processed)
{
    Current_Start = Get_Start_of_Current_Defect( );
    Current_Stop = Get_Stop_of_Current_Defect( );
    Next_Start = Get_Start_of_Next_Defect( );
    Next_Stop = Get_Stop_of_Next_Defect( );
    if (Current_Stop < Next_Start)
    {       The next defect is independent of the current defect
            Process the next defect
    }
    elseif (Next_Stop <= Current_Stop)
    {       The next defect starts and end in this defect
            It is wholly contained
            Process next defect
    }
    else
    {
            Then this is true: Next_Start <= Current_Stop
            The next defects starts in this defect but spans out of it
            Current_Stop = Next_Stop;
            Process the next defect
    }
}
```

TABLE II illustrates the results of the coalescing process. The bit location values were contrived in order to demonstrate the algorithm whereas in practice, defects occur with far less frequency. Random defects are the defects from one of the defect sources and media defects are defects from a second defect source. It is immaterial whether these are actually 'random' or 'media' defects. For purposes of coalescing they are simply different sets of start and stop locations in the Codeword Data Structure. Coalesced defects represent the final, merged defect locations in the Codeword Data Structure.

TABLE II

| Defect Locations | | | | | |
|---|---|---|---|---|---|
| Random Defects | | Media Defects | | Coalesced Defects | |
| Start Bit | Stop Bit | Start Bit | Stop Bit | Start Bit | Stop Bit |
| 23 | 23 | 71 | 123 | 23 | 23 |
| 543 | 569 | 723 | 841 | 71 | 123 |
| 679 | 995 | 1998 | 2018 | 543 | 569 |
| 791 | 1223 | 3001 | 3313 | 679 | 1223 |
| 873 | 1021 | 3458 | 3501 | 1312 | 1376 |
| 1312 | 1376 | | | 1998 | 2018 |
| 2116 | 2341 | | | 2116 | 2341 |
| 2773 | 2993 | | | 2773 | 2993 |
| 3456 | 3457 | | | 3001 | 3313 |
| 3928 | 3935 | | | 3456 | 3457 |
| | | | | 3458 | 3501 |
| | | | | 3928 | 3935 |

Notice that in the random defects, a single independent bit error occurs in bit 23. A longer independent error occurs beginning at bit 543. A spanning defect begins at bit 679 and ends at 1223 because the defects that start at 679 and 791 contain overlapping regions. A contained defect starts at bit 873 and ends at bit 1021, both values of which are wholly contained within the defect that begins at 791 add ends at 1223. The defect that began at 3928 spanned out of the 3936-bit Codeword Data Structure. Therefore it was truncated at 3935.

The Media Defects are all independent of each other. However it is noticed that the defect that begins at 723 is contained within the Random Defect from 679 to 995. The Random Defect from 3456 to 3457 combines with the Media Defect from 3468 to 3501.

Defect Processing

The number of bytes in error within a Codeword Data Structure, and their distribution into even or odd codeword pairs if two-way interleaving is used, is determined in a defect processor 320 by converting bit numbers to byte numbers and recognizing which resulting byte numbers belong to which codewords within the Codeword Data Structure.

The ProcessDefect algorithm accepts the array of defect starting and stopping bit locations and the interleaving factor. The starting and stopping bytes for each defect may then be determined, resulting in an array 322 indicating the number of errors in each interleaved codeword.

[even_errors, odd_errors]=ProcessDefect(start_bit, stop_bit, interleave)

For a two-way interleave, the following pseudo-code illustrates the conversion:

```
start_byte = floor(start_bit/8);
stop_byte = floor(stop_bit/8);
even_errors = 0;
odd_errors = 0;
% Sum codeword structure errors into each the even and odd bytes
% Result is total errors in each interleave.
% two-way interleave
```

```
if (interleave == 2)
    for byte= start_byte:stop_byte
        odd = mod(byte, 2);
        if odd
            odd_errors = odd_errors+1;
        else
            even_errors = even_errors+1;
        end
    end
end
```

Predicting Probabilities

Once the number of errors that occur in the even and odd codewords is determined, for each of many Codeword Data Structures processed, the probability may be computed 324 of the occurrence of N bytes in error per processed codeword. For example, a demonstration was performed for two defect streams with the following input parameters:

| Number of codewords processed: | 2,621,440 |
|---|---|
| Random Defects: | |
| mean sep = | 370,196.1 [bits] |
| mean size = | 4.5 [bits] |
| Media Defects: | |
| mean sep = | 11,105,882.4 [bits] |
| mean size = | 15.0 [bits] |

A histogram 326 of defect length, Table III, may then be generated and output. Table III shows the number of even and odd codewords having 1 byte in error, the number of even and odd codewords having 2 bytes in error, etc. The rate at which such errors occurred may be computed because the total number of codewords processed is known.

TABLE III

| | Error Histogram | | | |
|---|---|---|---|---|
| Number of Defects | Even Codewords | Odd Codewords | Sum of Even and Odd Codewords | Rate of Error |
| 1 | 17,131 | 17,330 | 34,461 | 6.6E−003 |
| 2 | 1,167 | 1,212 | 2,379 | 4.5E−004 |
| 3 | 109 | 103 | 212 | 4.0E−005 |
| 4 | 21 | 22 | 43 | 8.2E−006 |
| 5 | 10 | 9 | 19 | 3.6E−006 |
| 6 | 3 | 2 | 5 | 9.5E−007 |
| 7 | 1 | 1 | 2 | 3.8E−007 |
| 8 | 2 | 2 | 4 | 7.6E−007 |

The histogram data may be used to estimate the number of bytes in error in a codeword and the probability of such an event. Because error correction codes are designed to correct up to a fixed, known number of bytes in error per codeword, the histogram data can be used to suggest both the total number of bytes in error that the code should be designed to correct and the number of codewords that such a code cannot correct or the probability of the occurrence of uncorrectable errors. The number of codewords that cannot be corrected then either represent data loss or may be subjected to another level of error correcting processing.

Figure 5:
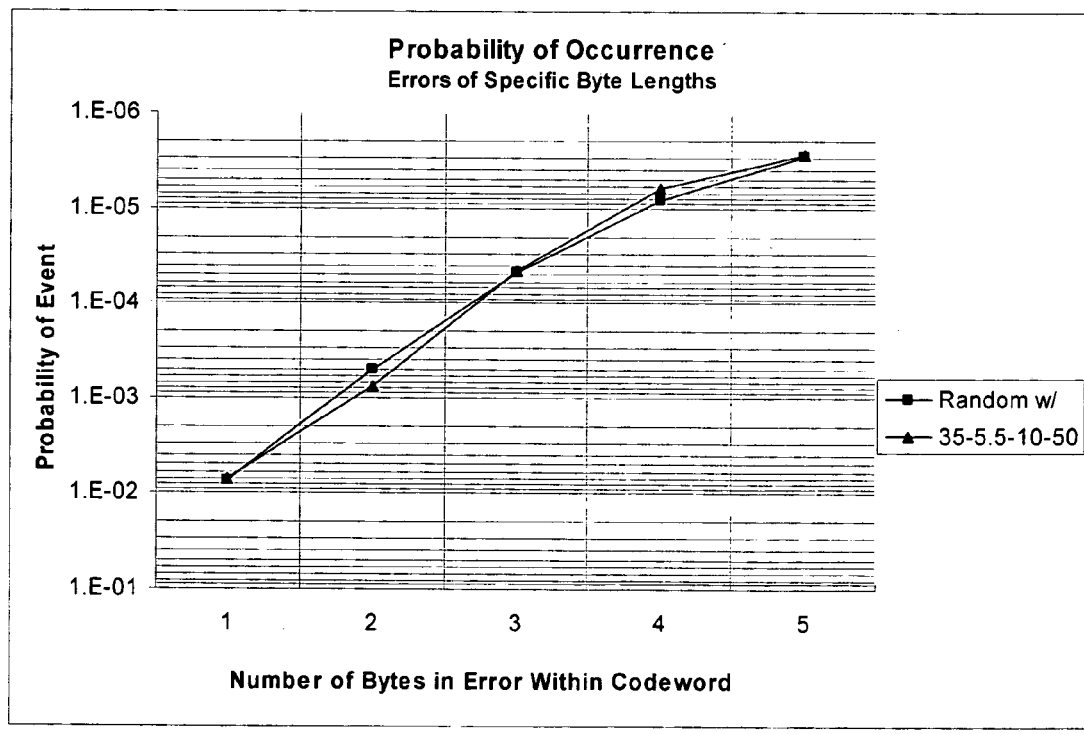
FIG. 5 is a plot of the probability of occurrence of errors of specific byte lengths for model according to the present invention and for an observed system.

The plot of FIG. 5 illustrates the close agreement between measured laboratory data and the prediction of the model of the present invention. It will be observed that the model predicts the actual performance to a very high degree. The model parameters are within the range of expected, physical values. They were:

| | | |
|---|---|---|
| Random defect rate | 35 | events/meter |
| Random defect size | 5.5 | bits mean value |
| Media defect rate | 10 | events/meter |
| Media defect size | 50 | bits mean value |

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies regardless of the particular type of signal bearing media actually used to carry out the distribution. Examples of computer readable media include recordable-type media such as a floppy disk, a hard disk drive, a RAM, and CD-ROMs and transmission-type media such as digital and analog communication links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to methods and systems, the need in the art may also be met with a computer program product containing instructions for modeling the error characteristics of a communications system.

What is claimed is:

1. A method for modeling the error characteristics of a communications system, comprising:
    establishing a number of simulated defect streams comprising a plurality of codewords;
    for each simulated defect stream:
        specifying a mean defect separation; and
        specifying a mean defect size;
    generating a defect array for each simulated defect stream, comprising storing in the defect array the starting location and the ending location of each defect within a codeword;
    concatenating the defect arrays generated from each data stream into a new defect array;
    merging overlapping defects in the new defect array;
    apportioning the merged defects to the codewords;
    generating a histogram of the number of codewords processed having k bytes in error, where k=[0 . . . m] and m equals a predetermined maximum number; and
    based upon the number and location of codeword errors and an error correction capability of an error correction code, estimating the probability of a failure in the error correction code.

2. The method of claim 1, further comprising:
    generating the starting locations from observations of an exponential distribution of starting locations having a mean equal to the specified mean defect separation; and
    generating the stopping locations from observations of an exponential distribution of starting locations having a mean equal to the specified mean defect size.

3. The method of claim 1, further comprising processing a next codeword if a codeword contains no defects.

4. The method of claim 1, wherein merging overlapping defects comprises executing a logical OR on the defects in the new defect array.

5. The method of claim 1, wherein merging overlapping defects comprises:
    sorting the new defect array by ascending starting bits;
    converting the defect starting and stopping bits to corresponding byte locations; and
    coalescing the resulting defect bytes.

6. The method of claim 1, wherein, if the codeword structure includes interleaved even and odd codewords, apportioning the defects comprises:
    summing the number of bytes in which defects start, continue or stop in an even codeword to determine the number of bytes in error in the even codeword; and
    summing the number of bytes in which defects start, continue or stop in an odd codeword to determine the number of bytes in error in the odd codeword.

7. The system of claim 1, further calculating the probability of the occurrence of N bytes in error per processed codeword.

8. A system for modeling the error characteristics of a communications system, comprising:
    an input configured to receive defect parameters, including:
        an interleave number for interleaving simulated codewords;
        a value identifying a number of a plurality of simulated defect streams from respective simulated defect sources; and
        for each simulated defect stream, a mean defect separation in bits and a mean defect size in bits;
    a codeword generator configured to generate a stream of simulated codewords;
    a codeword interleaver configured to interleave the simulated codewords according to the input interleave number and to output a stream of codeword data structures;
    a defect generator configured to inject simulated defects into the codeword data structure stream according to the input parameters and to output the simulated defect streams;
    a combined defect array having an entry for each defect in each simulated defect stream, each entry comprising a starting location and an ending location of the defect;
    a merge module configured to coalesce overlapping simulated defects; and
    a defect processor configured to determine the number of bytes in error in each codeword data structure.

9. The system of claim 8, further comprising a histogram generator coupled to the defect processor and configured to output a visual indication of the number of bytes in error in each codeword data structure.

10. The system of claim 8, further comprising a filter associated with each simulated defect stream and configured to pass only codeword data structures in the simulated defect streams having at least one defective bit.

11. The system of claim 8, wherein the merge module comprises:
    a sorter configured to sort the entries in the combined defect array based upon the starting location of each defect; and
    a coalescer configured to merge overlapping defects into a single defect based upon the starting and ending locations of each defect.

12. The system of claim 8, further comprising a probability calculator configured to calculate the probability of the occurrence of N bytes in error per processed codeword.

13. A computer program product of a computer readable medium usable with a programmable computer, the computer program product having computer-readable code embodied therein for modeling the error characteristics of a communications system, the computer-readable code comprising instructions for:

establishing a number of simulated defect streams comprising a plurality of codewords;

for each simulated defect stream:
specifying a mean defect separation; and
specifying a mean defect size;

generating a defect array for each simulated defect stream, comprising storing in the defect array the starting location and the ending location of each defect within a codeword;

concatenating the defect arrays generated from each data stream into a new defect array;

merging overlapping defects in the new defect array;

apportioning the merged defects to the codewords;

generating a histogram of the number of codewords processed having k bytes in error, where k=[0 . . . m] and m equals a predetermined maximum number; and based upon the number and location of codeword errors and an error correction capability of an error correction code, estimating the probability of a failure in the error correction code.

14. The computer program product of claim 13, the computer-readable code further comprising instructions for:

generating the starting locations from observations of an exponential distribution of starting locations having a mean equal to the specified mean defect separation; and generating the stopping locations from observations of an exponential distribution of starting locations having a mean equal to the specified mean defect size.

15. The computer program product of claim 13, the computer-readable code further comprising instructions for processing a next codeword if a codeword contains no defects.

16. The computer program product of claim 13, wherein the instructions for merging overlapping defects comprise instructions for executing a logical OR on the defects in the new defect array.

17. The computer program product of claim 13, wherein the instructions for merging overlapping defects comprise instructions for:

sorting the new defect array by ascending starting bits;

converting the defect starting and stopping bits into corresponding byte locations; and coalescing the resulting defect bytes.

18. The computer program product of claim 13, wherein, if the codeword structure includes interleaved even and odd codewords, the instructions for apportioning the defects comprise instructions for:

summing the number of bytes in which defects start, continue or stop in an even codeword to determine the number of bytes in error in the even codeword; and summing the number of bytes in which defects start, continue or stop in an odd codeword to determine the number of bytes in error in the odd codeword.

19. The computer program product of claim 13, the computer-readable code further comprising instructions for calculating the probability of the occurrence of N bytes in error per processed codeword.

20. A method for designing an error correction code for a communications system, comprising:

a) defining a simulated codeword data structure;

b) defining one or more simulated defect streams, each simulated defect stream representing a simulated defect source;

c) generating a set of defects having zero or more simulated defects from each of the simulated defect streams, each defect being defined by a starting location and an ending location within the simulated codeword data structure;

d) if zero defects are generated for all of the simulated defect streams, repeating step c) for a next set of defects;

e) merging the starting and stopping locations of the simulated defects in the set of defects;

f) determining the number and locations of merged simulated defects;

g) repeating steps c) through f) a plurality of iterations, each iteration representing one codeword processed;

h) determining the probability of occurrence of N-bytes in error per codeword processed; and i) designing an error correction code to correct errors in a data stream up to and including N-bytes in error per codeword in the data stream.

21. The method of claim 20, wherein defining one or more simulated defect streams comprises:

establishing a mean defect separation for simulated defects in each simulated defect stream; and establishing a mean defect size for simulated defects in each simulated defect stream.

22. The method of claim 21, wherein:

defining a starting location of a simulated defect comprises applying an observed exponential distribution of start locations having a mean equal to the established mean defect separation; and defining a stopping location of a simulated defect comprises applying an observed exponential distribution of start locations having a mean equal to the established mean defect size.

23. The method of claim 20, wherein merging comprises:

aggregating overlapping defects;

subsuming contained defects; and truncating defects which extend beyond boundaries of the codeword data structure.

24. The method of claim 20, wherein defining a simulated codeword data structure comprises establishing a codeword interleave factor whereby a codeword data structure comprises at least two interleaved codewords.

25. The method of claim 24, further comprising apportioning the merged simulated defects to the codewords interleaved in the codeword data structure.

26. A system for designing an error correction code for a communications system, comprising:

means for defining a simulated codeword data structure;

means for defining one or more simulated defect streams, each simulated defect stream representing a simulated defect source;

means for generating a set of defects having zero or more simulated defects from each of the simulated defect streams, each defect being defined by a starting location and an ending location within the simulated codeword data structure;

means for returning processing to the means for generating to generate a next set of defects if zero defects are generated for all of the simulated defect streams;

means for merging the starting and stopping locations of the simulated defects in the set of defects;

means for determining the number and locations of merged simulated defects;

means for returning process to the means for generating over a plurality of iterations, each iteration representing one codeword processed;

means for determining the probability of occurrence of N-bytes in error per codeword processed; and means for designing an error correction code to correct errors in a data stream up to and including N-bytes in error per codeword in the data stream.

27. The system of claim 26, wherein the means for defining one or more simulated defect streams comprises:

means for receiving an input establishing a mean defect separation for simulated defects in each simulated defect stream; and means for receiving an input establishing a mean defect size for simulated defects in each simulated defect stream.

28. The system of claim 27, wherein:

the means for defining a starting location of a simulated defect comprises means for applying an observed exponential distribution of start locations having a mean equal to the established mean defect separation; and the means for defining a stopping location of a simulated defect comprises means for applying an observed exponential distribution of start locations having a mean equal to the established mean defect size.

29. The system of claim 26, wherein the means for merging comprises:

means for aggregating overlapping defects;

means for subsuming contained defects; and means for truncating defects which extend beyond boundaries of the codeword data structure.

30. The system of claim 26, wherein the means for defining a simulated codeword data structure comprises means for receiving an input establishing a codeword interleave factor whereby a codeword data structure comprises at least two interleaved codewords.

31. The system of claim 30, further comprising means for apportioning the merged simulated defects to the codewords interleaved in the codeword data structure.

* * * * *